United States Patent
Noh et al.

(10) Patent No.: US 11,271,591 B2
(45) Date of Patent: Mar. 8, 2022

(54) SC-LDPC CODE ENCODING METHOD AND DEVICE THEREFOR

(71) Applicants: LG ELECTRONICS INC., Seoul (KR); INDUSTRY-UNIVERSITY COOPERATION FOUNDATION HANYANG UNIVERSITY, Seoul (KR)

(72) Inventors: Kwangseok Noh, Seoul (KR); Dong-Joon Shin, Seoul (KR); Hyeong-Gun Joo, Seoul (KR); Jiho Kim, Seoul (KR)

(73) Assignees: LG ELECTRONICS INC., Seoul (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/619,071

(22) PCT Filed: Jun. 9, 2017

(86) PCT No.: PCT/KR2017/006019
§ 371 (c)(1),
(2) Date: Dec. 3, 2019

(87) PCT Pub. No.: WO2018/225885
PCT Pub. Date: Dec. 13, 2018

(65) Prior Publication Data
US 2020/0099398 A1    Mar. 26, 2020

(51) Int. Cl.
*H03M 13/11* (2006.01)
*H03M 13/00* (2006.01)

(52) U.S. Cl.
CPC ...... *H03M 13/116* (2013.01); *H03M 13/1148* (2013.01); *H03M 13/1154* (2013.01); *H03M 13/1157* (2013.01); *H03M 13/616* (2013.01)

(58) Field of Classification Search
CPC ........... H03M 13/116; H03M 13/1154; H03M 13/1157
See application file for complete search history.

(56) References Cited

U.S. PATENT DOCUMENTS

| 2004/0187129 A1* | 9/2004 | Richardson | .......... H03M 13/116 718/100 |
| 2005/0204253 A1* | 9/2005 | Sukhobok | ............ H03M 13/118 714/752 |

(Continued)

FOREIGN PATENT DOCUMENTS

| JP | 2015133677 | 7/2015 |
| JP | 2016134883 | 7/2016 |

(Continued)

OTHER PUBLICATIONS

Christian Hager, Alexandre Graell i Amat, Fredrik Brannstrom, Alex Alvarado, and Erik Agrell; "Comparison of Terminated and Tailbiting Spatially Coupled LDPC Codes With Optimized Bit Mapping for PM-64-QAM", 2014 European Conference on Optical Communication, ECOC 2014; Cannes; France; 21 (Year: 2014).*

(Continued)

*Primary Examiner* — Joseph D Torres
(74) *Attorney, Agent, or Firm* — Lee Hong Degerman Kang Waimey

(57) ABSTRACT

Disclosed is an encoding method of a spatially coupled-low density parity Check (SC-LDPC) code of a terminal. The encoding method of the SC-LDPC code of the present disclosure can comprise: a step of generating a plurality of decomposition matrices by decomposing a base matrix of a preset LDPC block code. a step of generating a base matrix (Continued)

of the SC-LDPC code by spatially coupling the plurality of decomposition matrices in accordance with the termination length. a step of generating a circulant shift value matrix from the base matrix of the SC-LDPC code. a step of generating a plurality of lifting values for the base matrix of the SC-LDPC code. and a step for encoding an input signal by using a generator matrix defined by using of the base matrix of the SC-LDPC code, the circulant shift value matrix, and the plurality of lifting values.

8 Claims, 21 Drawing Sheets

(56) References Cited

U.S. PATENT DOCUMENTS

| | | | | |
|---|---|---|---|---|
| 2007/0162815 | A1* | 7/2007 | El-Khamy | H03M 13/6393 714/752 |
| 2010/0257425 | A1* | 10/2010 | Yue | H03M 13/033 714/752 |
| 2016/0094246 | A1* | 3/2016 | Vasista Srinivasan Ranganathan | H03M 13/1117 714/776 |
| 2016/0164538 | A1* | 6/2016 | Abu-Surra | H03M 13/1154 714/776 |
| 2017/0331494 | A1* | 11/2017 | Richardson | H04L 1/0058 |

FOREIGN PATENT DOCUMENTS

| | | |
|---|---|---|
| KR | 1020150064695 | 6/2015 |
| WO | 2015101521 | 7/2015 |

OTHER PUBLICATIONS

PCT International Application No. PCT/KR2017/006019, Written Opinion of the International Searching Authority dated Mar. 2, 2018, 20 pages.

* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & \cdots & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

$$V = \begin{bmatrix} 1 & 0 & 1 & 1 & 1 & 0 & 1 & 1 & 0 & 0 \\ 0 & 1 & 1 & 0 & 0 & 1 & 1 & 0 & 1 & 1 \\ 1 & 1 & 0 & 1 & 1 & 1 & 0 & 1 & 0 & 0 \\ 0 & 1 & 1 & 0 & 1 & 0 & 1 & 0 & 1 & 1 \\ 1 & 0 & 0 & 1 & 0 & 1 & 0 & 1 & 1 & 1 \end{bmatrix}$$

$$\downarrow$$

$$V_0 = \begin{bmatrix} 1 & 0 & 0 & 1 & 0 & 0 & 0 & 0 & 0 & 0 \\ 0 & 1 & 0 & 0 & 0 & 0 & 0 & 0 & 0 & 1 \\ 0 & 0 & 0 & 0 & 1 & 1 & 0 & 0 & 0 & 0 \\ 0 & 0 & 1 & 0 & 0 & 0 & 0 & 0 & 1 & 0 \\ 0 & 0 & 0 & 1 & 0 & 0 & 0 & 1 & 0 & 0 \end{bmatrix}$$

$$V_1 = \begin{bmatrix} 0 & 0 & 1 & 0 & 1 & 0 & 0 & 0 & 0 & 0 \\ 0 & 0 & 1 & 0 & 0 & 0 & 1 & 0 & 0 & 0 \\ 1 & 0 & 0 & 1 & 0 & 0 & 0 & 0 & 0 & 0 \\ 0 & 1 & 0 & 0 & 0 & 0 & 0 & 0 & 0 & 1 \\ 0 & 0 & 0 & 0 & 0 & 1 & 0 & 0 & 1 & 0 \end{bmatrix}$$

$$V_2 = \begin{bmatrix} 0 & 0 & 0 & 0 & 0 & 0 & 1 & 1 & 0 & 0 \\ 0 & 0 & 0 & 0 & 0 & 1 & 0 & 0 & 1 & 0 \\ 0 & 1 & 0 & 0 & 0 & 0 & 0 & 1 & 0 & 0 \\ 0 & 0 & 0 & 0 & 1 & 0 & 1 & 0 & 0 & 0 \\ 1 & 0 & 0 & 0 & 0 & 0 & 0 & 0 & 0 & 1 \end{bmatrix}$$

FIG. 18

$$B = \begin{bmatrix} V_0 & & & & & & & & \\ V_1 & V_1 & & & & & & & \\ V_2 & V_1 & V_1 & & & & & & \\ \vdots & V_2 & V_1 & & & & & & \\ V_{M-2} & \vdots & V_2 & & & & & & \\ V_{M-1} & V_{M-2} & \vdots & & & & V_0 & & \\ & V_{M-1} & V_{M-2} & & & & V_1 & & \\ & & V_{M-1} & & & & V_2 & & \\ & & & & & & \vdots & & \\ & & & & & & V_{M-2} & & \\ & & & & & & V_{M-1} & & \end{bmatrix}$$

Termination Length L

FIG. 19

$$B = \begin{bmatrix} V_0 & & & & & & \\ V_1 & V_0 & & & & & \\ & V_1 & V_0 & & & & \\ & & V_1 & V_0 & & & \\ & & & V_1 & & & \\ & & & & & V_0 & \\ & & & & & V_1 & \end{bmatrix}$$

Termination Length L

FIG. 20

$$\begin{bmatrix} \beta^{31} & \beta^{32} & \cdots & \beta^{62} \\ 1+\beta^{31} & 1+\beta^{31} & \cdots & 1+\beta^{31} \\ \vdots & \vdots & \ddots & \vdots \\ \beta^{30}+\beta^{31} & \beta^{30}+\beta^{32} & \cdots & \beta^{30}+\beta^{62} \end{bmatrix}$$

FIG. 21a $$H_{[0,n]}^T = \begin{bmatrix} h_1^{(0)}(0) & h_1^{(1)}(1) & \cdots & h_1^{(M)}(M) & 0 & \cdots & 0 \\ h_1^{(0)}(0) & h_2^{(1)}(1) & \cdots & h_2^{(M)}(M) & 0 & & \\ 0 & h_1^{(0)}(1) & \cdots & \vdots & h_1^{(M)}(M+1) & & \\ \vdots & h_2^{(0)}(1) & \cdots & & h_2^{(M)}(M+1) & & \\ & 0 & \ddots & & \vdots & & \vdots \\ & & \ddots & & & & 0 \\ & & & & & & h_1^{(M)}(n) \\ & & & & & & h_2^{(M)}(n) \\ & & & & & & \vdots \\ & & & & & & 0 & h_2^{(0)}(n) \end{bmatrix}$$

FIG. 23

$$V = \begin{bmatrix} 1 & 0 & 2 & 0 & 0 & 1 & 0 & 0 & 1 & 1 \\ 0 & 1 & 3 & 1 & 1 & 1 & 0 & 1 & 0 & 1 \\ 0 & 1 & 1 & 2 & 2 & 2 & 1 & 2 & 2 & 2 \\ 0 & 0 & 2 & 0 & 0 & 0 & 2 & 0 & 1 & 0 \end{bmatrix}$$

FIG. 24

$$V_0 = \begin{bmatrix} 1 & 0 & 1 & 0 & 0 & 1 & 0 & 0 & 1 & 0 \\ 0 & 0 & 1 & 1 & 0 & 0 & 0 & 1 & 0 & 1 \\ 0 & 0 & 0 & 1 & 1 & 1 & 1 & 1 & 1 & 1 \\ 0 & 0 & 1 & 0 & 0 & 0 & 1 & 0 & 0 & 0 \end{bmatrix}$$

$$V_1 = \begin{bmatrix} 0 & 0 & 1 & 0 & 0 & 0 & 0 & 0 & 0 & 1 \\ 0 & 1 & 2 & 0 & 1 & 1 & 0 & 0 & 0 & 0 \\ 0 & 1 & 1 & 1 & 1 & 1 & 0 & 1 & 1 & 1 \\ 0 & 0 & 1 & 0 & 0 & 0 & 1 & 0 & 1 & 0 \end{bmatrix}$$

FIG. 25

$$B = \begin{bmatrix} V_0 & & & & & & & \\ V_1 & V_0 & & & & & & \\ & V_1 & V_0 & & & & & \\ & & V_1 & V_0 & & & & \\ & & & V_1 & V_0 & & & \\ & & & & V_1 & V_0 & & \\ & & & & & V_1 & V_0 & \\ & & & & & & V_1 & \end{bmatrix}$$

Termination Length L=6

FIG. 26

$$\begin{pmatrix} \beta^{255} & \beta^{256} & \cdots & \beta^{510} \\ 1+\beta^{255} & 1+\beta^{256} & & 1+\beta^{560} \\ \vdots & & \ddots & \vdots \\ \beta^{254}+\beta^{255} & \beta^{254}+\beta^{256} & \cdots & \beta^{254}+\beta^{510} \end{pmatrix}$$

FIG. 27

$$B_{2/3} = \begin{bmatrix} 1 & 0 & 2 & 0 & 0 & 1 & 0 & 0 & 1 & 1 \\ 0 & 1 & 3 & 1 & 1 & 1 & 0 & 1 & 0 & 1 \\ 0 & 1 & 1 & 2 & 2 & 2 & 1 & 2 & 2 & 2 \\ 0 & 0 & 2 & 0 & 0 & 0 & 2 & 0 & 1 & 0 \end{bmatrix}$$

SC-LDPC CODE ENCODING METHOD AND DEVICE THEREFOR

CROSS-REFERENCE TO RELATED APPLICATIONS

This application is the National Stage filing under 35 U.S.C. 371 of International Application No. PCT/KR2017/006019, filed on Jun. 9, 2017, the contents of which are hereby incorporated by reference herein in its entirety.

TECHNICAL FIELD

The present disclosure relates to a method and apparatus for generating a protograph-based spatially coupled low-density parity-check (SC-LDPC) code, and more particularly, to a method of constructing an SC-LDPC parity check matrix by decomposition and multi-stage lifting.

BACKGROUND ART

Wireless access systems have been widely deployed to provide various types of communication services such as voice or data. In general, a wireless access system is a multiple access system supporting communication with multiple users in shared available system resources (bandwidth, transmission power, and so on). For example, multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multi-carrier frequency division multiple access (MC-FDMA) system.

Channel codes are essential in broadcasting systems as well as the above communication systems. In a general method of configuring a channel code, for example, a transmitter may encode input symbols by an encoder and transmit the code symbols. For example, the receiver may receive the code symbols and recover the input symbols by decoding the received code symbols. The size of an input symbol and the size of a code symbol may vary depending on a communication system. For example, for a turbo code for data information used in a $3^{rd}$ generation partnership project (3GPP) long term evolution (LTE) communication system, an input symbol is up to 6144 bits long, and a code symbol is 18432 (611*3) bits long. For turbo coding in the LTE communication system, see 3GPP TS 36.212.

In view of the structure of the LTE turbo code, when the signal-to-noise ratio (SNR) increases above a certain range, performance improvement is negligibly slight. In this regard, a code with a lower error rate may be considered, but with increased complexity.

In a communication system, a high error rate may bring about unnecessary data retransmission and channel reception failure. Moreover, an extremely complex code may cause transmission and reception latency as well as increase the loads of a base station (BS) and a user equipment (UE). Particularly, the above problem needs to be overcome in the next-generation communication system requiring faster data transmission and reception.

Particularly, the current LTE turbo code exhibits an error floor, when the size of information increases. Accordingly, there is a need for a channel coding method satisfying ultra-reliable radio (URR) and low-latency radio (LLR).

DISCLOSURE

Technical Problem

An aspect of the present disclosure devised to solve the above problem is to provide a method of constructing a parity check matrix with a high degree of freedom for a spatially coupled low-density parity-check (SC-LDPC) code.

Another aspect of the present disclosure is to provide an apparatus supporting the above method.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

According to an embodiment of the present disclosure, a method of encoding a spatially coupled low-density parity-check (SC-LDPC) code by a user equipment (UE) may include generating a plurality of decomposition matrices by decomposing a base matrix of a predetermined LDPC block code (LDPC-BC), generating a base matrix of the SC-LDPC code by spatially coupling the plurality of decomposition matrices according to a termination length, generating a circulant shift value matrix from the base matrix of the SC-LDPC code, generating a plurality of lifting values for the base matrix of the SC-LDPC code, and encoding an input signal based on a generator matrix defined by the base matrix of the SC-LDPC code, the circulant shift value matrix, and the plurality of lifting values.

The circulant shift value matrix may be generated by a Latin Square algorithm or a progressive edge growth (PEG) algorithm.

The plurality of lifting values may include a first lifting value and a second lifting value, and the first lifting value may be applied to the base matrix of the SC-LDPC code, with priority over the second lifting value, and smaller than the second lifting value.

The plurality of decomposition matrices may be generated to have a minimum difference between check degrees of corresponding rows.

According to an embodiment of the present disclosure, a method of decoding an SC-LDPC code by a UE may include receiving an encoded input signal, and decoding the encoded input signal in a sliding window decoding scheme based on a parity check matrix. The parity check matrix may be defined by a base matrix of the SC-LDPC code, a circulant shift value matrix, and a plurality of lifting values, the base matrix of the SC-LDPC code may be generated by spatially coupling a plurality of decomposition matrices according to a termination length, the plurality of decomposition matrices may be generated by decomposing a base matrix of a predetermined LDPC-BC, and a window size of the sliding window decoding scheme may be an integer multiple of the number of the plurality of decomposition matrices.

The above aspects of the present disclosure are merely a part of preferred embodiments of the present disclosure. Various embodiments reflecting the technical features of the present disclosure could be derived and understood based on the following detailed description of the present disclosure by those skilled in the art.

Advantageous Effects

According to the embodiments of the present disclosure, the following effects are achieved.

According to the present disclosure, the method of generating a parity check matrix for a spatially coupled low-density parity-check (SC-LDPC) code has a high degree of freedom.

According to the present disclosure, a parity check matrix with excellent threshold performance or frame error rate (FER) performance may be generated.

According to the present disclosure, decoding complexity may be reduced through decoding similar to convolutional decoding.

Further, use of sliding window (SW) decoding may lead to reduction of hardware complexity and computational complexity as well as a memory size and a maximum repetition number.

It will be appreciated by persons skilled in the art that the effects that can be achieved with the present disclosure are not limited to what has been particularly described hereinabove and other advantages of the present disclosure will be more clearly understood from the following detailed description taken in conjunction with the accompanying drawings.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

FIG. 7 illustrates a structured parity check matrix according to an example.

FIG. 8 illustrates a model matrix according to an example.

FIG. 12 is a schematic diagram illustrating generation of a base matrix for a spatially coupled low-density parity-check (SC-LDPC) code in a cut-and-paste method.

FIG. 15 illustrates generation of decomposition matrices according to an example.

FIG. 18 illustrates a base matrix for an SC-LDPC code according to an example.

FIG. 19 illustrates a base matrix for another SC-LDPC code according to another example.

FIG. 20 illustrates a circulant shift value matrix according to an example.

FIG. 21a illustrates a parity check matrix according to an example.

FIG. 23 illustrates a base matrix V according to an example.

FIG. 24 illustrates decomposition matrices.

FIG. 25 illustrates a base matrix according to an example.

FIG. 26 illustrates a circulant shift value matrix according to an example.

FIG. 27 illustrates a base matrix for an SC-LDPC code according to an example.

FIG. 12 illustrates a method of decoding an LDPC code based on a syndrome check according to an example.

BEST MODE

The following description of embodiments of the present disclosure may apply to various wireless access systems including code division multiple access (CDMA), frequency division multiple access (FDMA), time division multiple access (TDMA), orthogonal frequency division multiple access (OFDMA), single carrier-frequency division multiple access (SC-FDMA), and so on. CDMA may be implemented with such a radio technology as universal terrestrial radio access (UTRA), CDMA 2000 and the like. TDMA may be implemented with such a radio technology as global system for mobile communications/general packet radio service/enhanced data rates for GSM evolution (GSM/GPRS/EDGE). OFDMA may be implemented with such a radio technology as IEEE 802.11 (Wi-Fi), IEEE 802.16 (WiMAX), IEEE 802.20, evolved UTRA (E-UTRA), etc. UTRA is a part of universal mobile telecommunications system (UMTS). 3$^{rd}$ generation partnership project (3GPP) system (UMTS) is a part of evolved UMTS (E-UMTS) that uses E-UTRA. 3GPP LTE adopts OFDMA in downlink (DL) and adopts SC-FDMA in uplink (UL). LTE-advanced (LTE-A) is an evolved version of 3GPP LTE.

While the following description is given in the context of 3GPP LTE/LTE-A, for clarity, this does not limit the technical idea of the present disclosure. Specific terms user in the following description are provided to help with understanding of the present disclosure, and may be replaced with other terms without departing from the scope and spirit of the disclosure.

Figure 1:
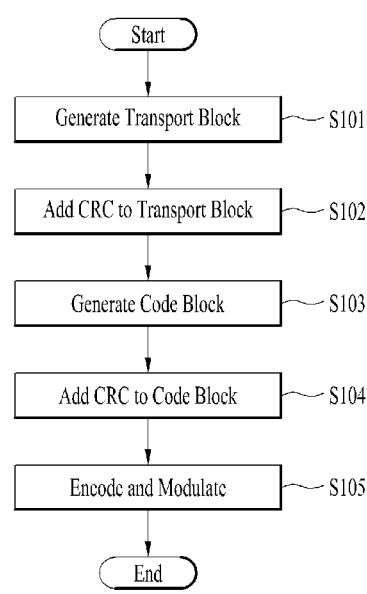
FIG. 1 is a flowchart illustrating an encoding procedure according to an example.

FIG. 1 is a flowchart illustrating an encoding procedure according to an example.

The encoding procedure illustrated in FIG. 1 may be applied to many channel codes including a turbo code used in an LTE communication system. For the convenience of description, the encoding procedure will be described based on terms as defined in technical specifications of the LTE communication system.

In the example of FIG. 1, a transmitter may generate a transport block (TB) (S101). The transmitter further adds the TB with cyclic redundancy check (CRC) bits for the TB (S102). The transmitter may generate code blocks (CBs) from the CRC bits-added TB (S103). For example, the transmitter may segment the TB into CBs based on an input size of an encoder. The transmitter may add CRC bits to each of the CBs resulting from the segmentation (S104). For example, the size of a CB and CB CRC bits may be 6144 bits. The transmitter may encode and modulate each block including a CB and CRC bits (S105). For example, turbo coding may be applied as describe before.

A decoding procedure may be performed in the reverse order of the encoding procedure illustrated in FIG. 1. For example, a receiver may performs decoding on a CB basis by a decoder corresponding to each encoder, construct one final TB, and determine whether the TB has passed a CRC check.

For example, the size of an input symbol may be different from the size of a TB from a medium access control (MAC) layer. When the TB size is larger than a maximum input symbol size of a turbo code, the TB may be segmented into a plurality of CBs. In the LTE standards, the size of a CB may be equal to a value obtained by subtracting the number of CRC bits from 6144 bits. An input symbol of the turbo code may be defined as data including a CB and a CRC or data including a TB (e.g., smaller than 6144 bits) and a CRC. The number of CRC bits is very small (e.g., up to 24 bits) relative to 6144 bits. Accordingly, unless otherwise defined, a CB may refer to a CB itself or a CB and CRC bits for the CB, and a TB may refer to a TB itself or a TB and CRC bits for the TB in the following description.

Figure 2:
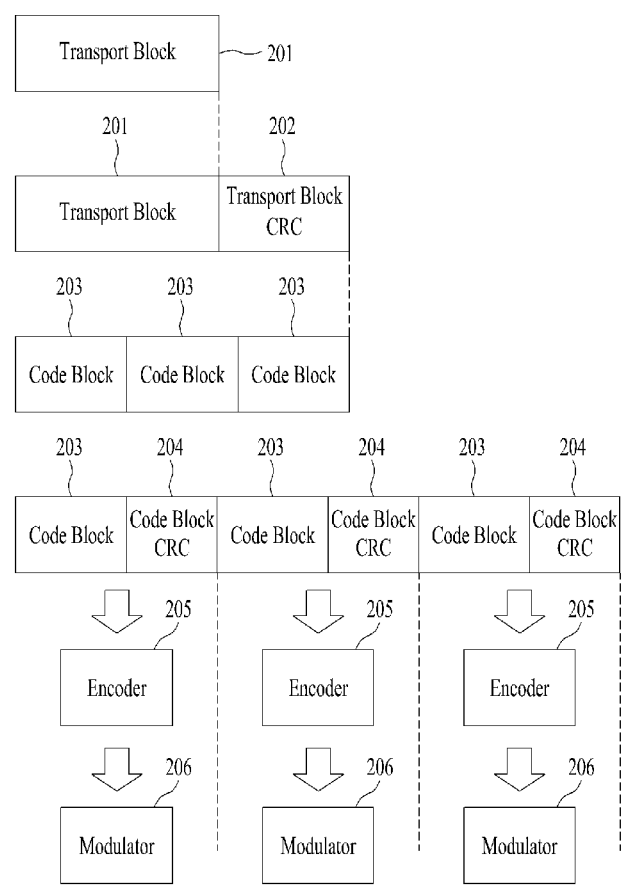
FIG. 2 illustrates an encoding procedure according to an example.

FIG. 2 illustrates a TB encoding procedure according to an example.

FIG. 2 illustrates a procedure of encoding a TB 201, which corresponds to the encoding procedure described above with reference to FIG. 1. First, a TB CRC 202 is added to the TB 201. The TB CRC 202 may be used to verify the TB 201 during decoding. Subsequently, the TB 201 and the TB CRC 202 are segmented into three CBs 203. While the TB 201 is segmented into three CBs 203 in this embodiment, the TB 201 may be segmented into a plurality of CBs based on an input size of an encoder 205.

Each of the CBs 203 is added with a CB CRC 204. The CB CRC 204 may be used to verify the CB 203 at a receiver. The CB 203 and the CB CRC 204 may be encoded through the encoder 205 and a modulator 206.

Figure 3:
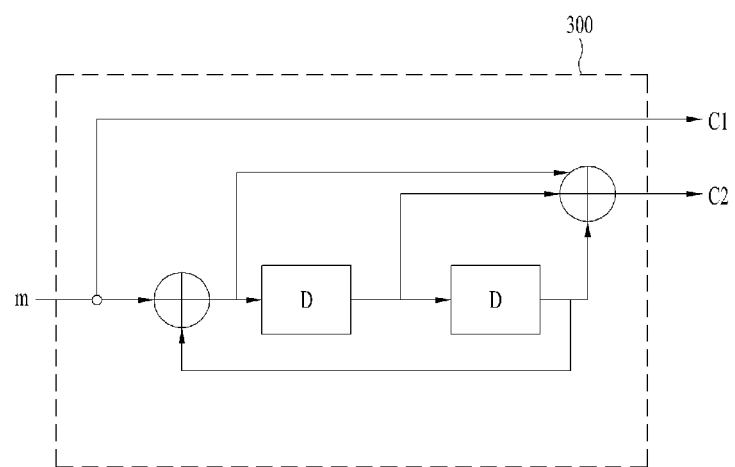
FIG. 3 illustrates a recursive systematic convolutional (RSC) encoder according to an example.

FIG. 3 illustrates a recursive systematic convolutional (RSC) encoder according to an example.

An RSC encoder 300 illustrated in FIG. 3 may be used for turbo coding. In FIG. 3, m represents input data, C1 represents a systematic bitstream, and C2 represents a coded bitstream. The RSC encoder 300 has a ½ code rate.

The RSC encoder 300 may be configured by feeding back a coded output to the input of a non-recursive-non-systematic convolutional encoder. In the embodiment of FIG. 3, the encoder 300 includes two delays 301 and 302. A value D of each of the delays 301 and 302 may be determined according to a coding scheme. The delays 301 and 302 may be configured as memories or shift registers.

Figure 4:
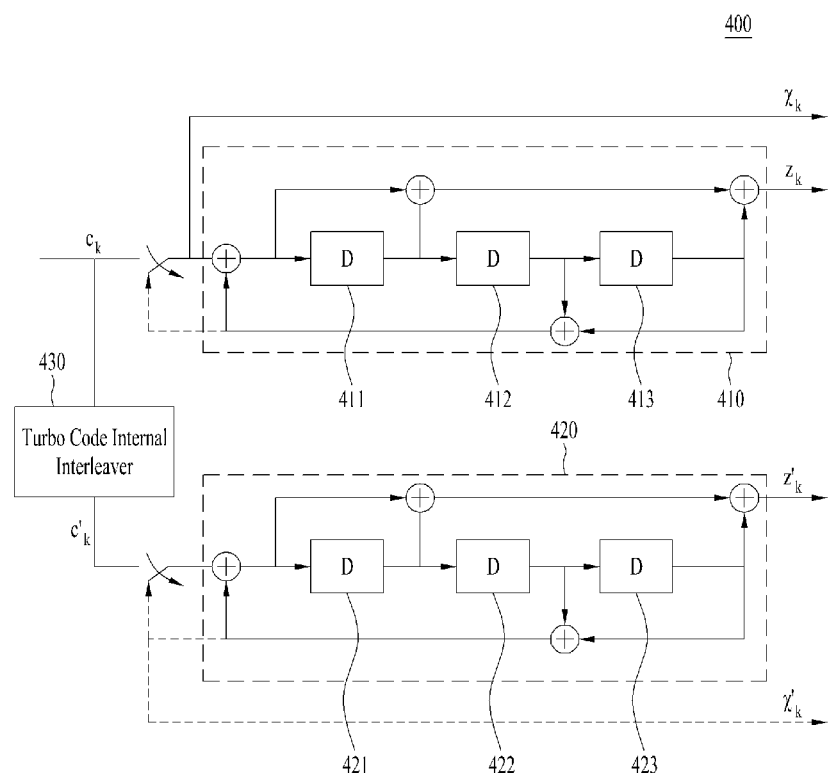
FIG. 4 illustrates a long term evolution (LTE) turbo encoder.

FIG. 4 illustrates an LTE turbo encoder.

A coding scheme for an LTE turbo encoder 400 is a parallel concatenated convolutional code (PCCC) involving two 8-state constituent encoders 410 and 420 and one turbo code internal interleaver 430.

In FIG. 4, the turbo encoder 400 includes the first constituent encoder 410, the second constituent encoder 420, and the turbo code internal interleaver 430. The first constituent encoder 410 and the second constituent encoder 420 are 8-state constituent encoders. Each of the first constituent encoder 410 and the second constituent encoder 420 is configured in a similar structure to the RSC encoder of FIG. 3. Each of the first constituent encoder 410 and the second constituent encoder 420 includes three delays 411, 412, and 413 or 421, 422, and 423.

In FIG. 4, D is a value determined according to a coding scheme, and $c_k$ is an input to the turbo encoder 400. The outputs of the first constituent encoder 410 and the second constituent encoder 420 are denoted by $z_k$ and $z_k'$, respectively. A value output from the turbo code internal interleaver 430 is denoted by $c_k'$. In general, the delays 411, 412, 413, 421, 42, and 423 may delay input values by one clock pulse each time. However, the delays 411, 412, 413, 421, 42, and 423 may be configured to delay input values by one or more clock pulses according to an internal setting. The delays 411, 412, 413, 421, 42, and 423 may be configured as shift registers, and configured to delay input bits by a predetermined number of clock pulses and then output the delayed bits to the next delays 411, 412, 413, 421, 42, and 423.

The turbo code internal interleaver 430 may reduce the effect of a burst error probably occurring during signal transmission on a radio channel. For example, the turbo code interval interleaver 430 may be a quadratic polynomial permutation (QPP) interleaver.

The turbo code, which is a forward error correction (FEC) code, is used in the LTE communication system. For example, a data block encoded by the turbo code may include three subblocks. One subblock may be m-bit payload data. Another subblock may be n/2 parity bits for the payload data, computed using an RSC code. The other subblock may be n/2 parity bits for a permutation of the payload data, again computed using an RSC code. For example, the permutation may be carried out by an interleaver. Thus, two redundant but different subblocks of parity bits may form one block together with payload. For example, when m is equal to n/2, the one block has a code rate of ⅓.

A process in which the input $c_k$ reaches the coded bits $z_k$ in the first constituent encoder 410 may be divided into two paths. The two paths are a first path connected from an input end to an output end without an output feedback, and a second path for feedback from the input end to the input end again.

In the first path, the input $c_k$, an input $c_k$ passed through the delay 411, and an input $c_k$ passed through the delays 411, 412 and 413 are applied to the output end. The relationship between the input end and the output end in the first path may be expressed as a polynomial. The polynomial for the first path is referred to as a forward generator polynomial, which may be expressed as g1 in the following equation.

$$g1(D)=1+D+D^3 \tag{1}$$

In the second path, the input $c_k$, an input $c_k$ passed through the delays 411 and 412, and the input $c_k$ passed through the delays 411, 412 and 413 are fed back to the input end. A polynomial for the second path is referred to as a recursive generator polynomial, which may be expressed as g0 in the following equation.

$$g0(D)=1+D^2+D^3 \tag{2}$$

In Equation 1 and Equation 2, "+" represents exclusive OR (XOR) and 1 represents no delay of an input. $D^n$ represents n delays of an input.

Figure 5:
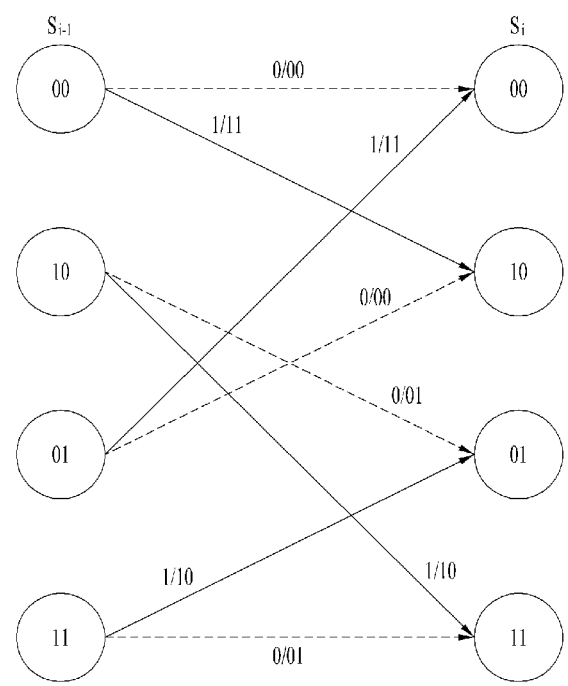
FIG. 5 illustrates an exemplary trellis for an RSC encoder.

FIG. 5 illustrates an exemplary trellis for an RSC encoder.

FIG. 5 illustrates the structure of a trellis in the RSC encoder illustrated in FIG. 3. In FIG. 5, $S_i$ represents the state of $i^{th}$ input data. In FIG. 5, each circle represents a node, and a line connected between nodes represents a branch. A solid line represents a branch for an input value of 1, and a dotted line represents a branch for an input value of 0. The value on a branch is m/C1C2 (input value/systematic bit, coded bit). The trellis may also have states of which the number is exponentially proportional to the number of memories of the encoder. For example, when the encoder includes a memories, $2^a$ states may be included in the trellis.

The trellis is a state machine which shows a possible state transition of an encoder between two states. A convolutional encoder such as an RSC encoder may perform coding according to a trellis diagram. A codeword encoded by the RSC encoder may be decoded according to an algorithm based on the trellis structure. For example, a Viterbi or Bahl, Cocke, Jelinek and Raviv (BCJR) algorithm may be used.

Figure 6:
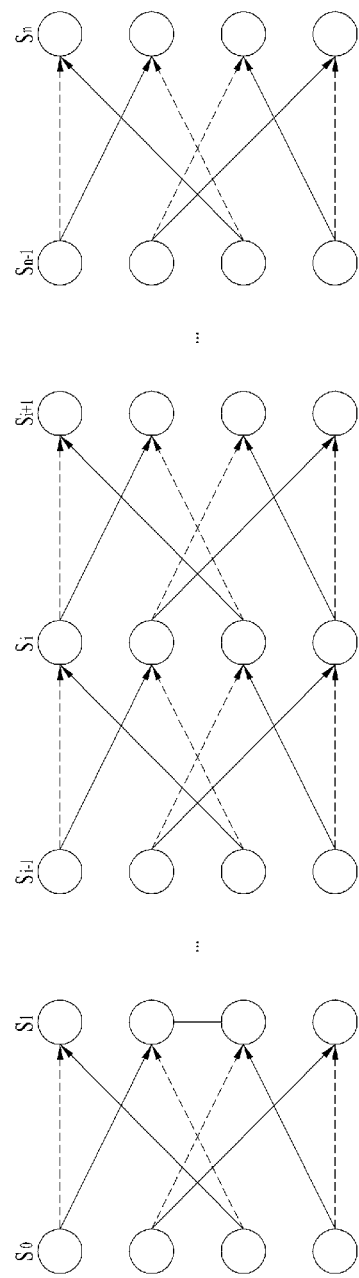
FIG. 6 illustrates an exemplary trellis structure.

FIG. 6 illustrates an exemplary trellis structure.

In FIG. 6, n denotes the length of a codeword. Typically, the trellis may be terminated by adding additional bits after an input sequence. In general, a sequence of 0s is referred to as tail bits. The tail bits terminate the trellis by causing nodes in one state of the trellis to have 0 as a value.

In FIG. 6, the length of a codeword may be determined in consideration of the length k of input data and the length t of tail bits. For example, when the code rate is R, the length n of the code word may be (k+t)/R. In general, the length t of tail bits may be determined to be a length to which all delays (e.g., memories) of the encoder may be reset. For example, the RSC encoder of FIG. 3 may use a total of 2 tail bits. The turbo encoder for LTE communication as illustrated in FIG. 4 may use 3 tail bits.

The length of tail bits is shorter than the length of input data. As described above, since the length of a codeword is related to the length of tail bits, the tail bits may lead to loss of a code rate, when the codeword length is limited. However, despite loss of a code rate caused by tail bits, trellis termination by tail biting is widely used. This is because computational complexity is low and excellent error correction performance is exhibited.

A punctured code refers to a partially punctured codeword. The punctured part of the codeword in the punctured code is not transmitted. For example, the punctured code may be used to reduce code rate loss caused by addition of tail bits. In this case, a receiver may perform decoding using a trellis corresponding to the sum of the length k of input data and the length t of tail bits. That is, the receiver may perform decoding on the assumption that it has received a non-punctured codeword. In this case, the receiver may consider that there is no input value for a branch from a node corresponding to punctured bits (i.e., bits which have not been transmitted from a transmitter). That is, for the branches of the node, the input data is assumed to be 0 or 1 with the same probability.

As described before with reference to FIG. 1, a CB CRC is added to a CB. The CRC may be determined to be a remainder derived by dividing transmission data by a predetermined check value as a divisor. In general, the CRC may be added to the end of the transmission data. The receiver may compare the remainder derived by dividing received data by the predetermined check value with the CRC or determine whether the remainder obtained by dividing the entire received data including the CRC by the check value is zero.

For a TB size of 6144 bits, a CRC may be up to 24 bits long. Accordingly, the number of the remaining bits except for the CRC bits is determined to be a CB size.

The receiver may perform decoding on a CB basis. Then, the receiver may configure a TB from CBs and check the CRC of the TB to determine whether the decoding is successful. In the current LTE system, a CB CRC is used for early decoding termination. For example, when a CB is failed in a CRC check, the receiver may transmit a negative acknowledgement (NACK) to the transmitter without decoding the remaining CBs.

Upon receipt of the NACK, the transmitter may retransmit at least a part of the transmission data. For example, the transmitter may retransmit the TB or one or more CBs. For example, when the TB is fully retransmitted, radio resources may be excessively consumed for the retransmission. For example, when a NACK occurs due to a CB CRC failure at the receiver, the receiver may transmit information about a CB to which the CRC failure has occurred (e.g., the index of the CB) to the transmitter. Further, the transmitter may transmit only the CB to which the CRC failure has occurred based on the information about the CB so as to increase radio resource efficiency. However, when the number of CBs is increased, the amount of data for feedback of information about the CBs (e.g., the indexes of the CBs) may be increased.

In the LTE communication system, the receiver may indicate to the transmitter by an ACK/NACK signal whether data has been successfully received. In frequency division duplex (FDD), an ACK/NACK for data received in an subframe is transmitted in an $(i+4)^{th}$ subframe. When a NACK is received in the $(i+4)^{th}$ subframe, a retransmission may be performed in an $(i+8)^{th}$ subframe. A TB processing time and an ACK/NACK generation time are considered in this operation. This is because much time is taken for processing a channel code to process a TB. In time division duplex (TDD), an ACK/NACK and a retransmission subframe may be determined based on a time required for processing a TB and generating an ACK/NACK, and a UL subframe allocation (e.g., a TDD UL/DL configuration). Further, ACK/NACK bundling and multiplexing may be used.

As described before once the SNR of the turbo code exceeds a predetermined SNR, a further enhancement in an error rate is negligibly slight. As an alternative to the turbo code, a low-density parity-check (LDPC) code has been proposed. The LDPC code is a linear block code, which is used in IEEE 802.1 in, IEEE 802.11ac, and digital video broadcasting (DVB). The LDPC code may be constructed by a generator matrix and a parity check matrix. In the LDPC code, data may be encoded by multiplying message hits by the generator matrix. In the communication standard using the LDPC code, a parity check matrix may generally be used instead of the generator matrix. For example, data encoding may be performed using the parity check matrix.

A linear block code may be generated based on a generator matrix G or a parity check matrix H. The linear block code is constructed such that $Hc^t$ is 0 for every codeword c. Like other linear block codes, the LDPC code may also be implemented by checking whether the product between the parity check matrix H and the codeword c is '0'. For example, the LDPC code may be decoded by determining whether the product (i.e., $Hc^t$) between the transpose matrix of the codeword c and the parity check matrix is 0.

For the LDPC code, the elements of the parity check matrix are mostly 0s, with a small number of non-zero elements relative to the length of the code. Accordingly, probability-based iterative decoding is possible for the LDPC code. For an initially proposed LDPC code, a non-systematic panty check matrix was defined, with a small weight applied uniformly to the rows and columns. A weight may refer to the number of is included in a row or a column.

As described before, the density of non-zero elements is low in the parity check matrix U of the LDPC code. Therefore, the LDPC code has performance close to Shannon's theoretical limit, with low complexity. In view of its high error correction performance and low decoding complexity, the LDPC code is suitable for high-speed wireless communication.

A description will be given below of a structured LDPC code.

Figures 7, 8:
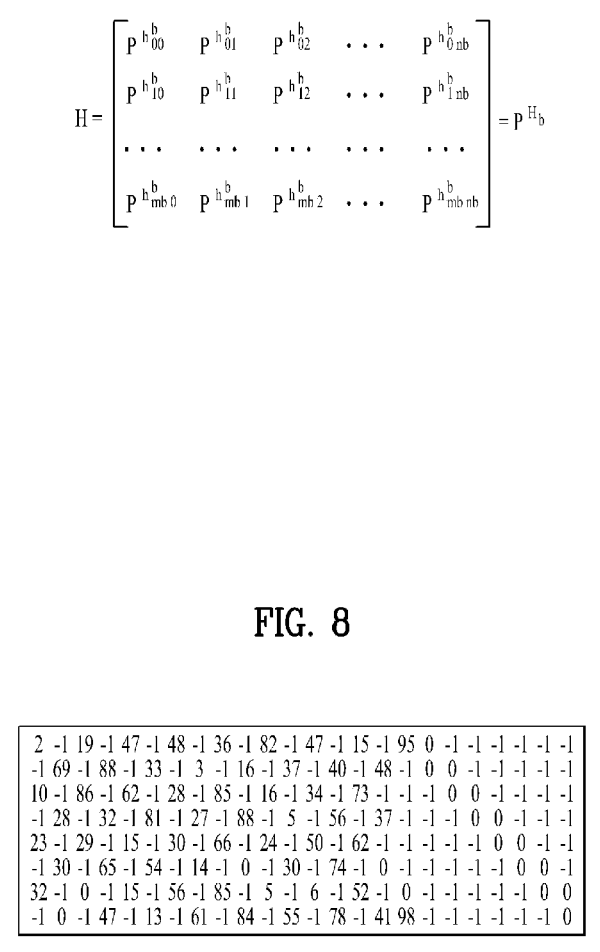

As described before, a parity check matrix H may be used to generate an LDPC code. The matrix H includes a large number of 0s and a small number of 1s. The matrix H may be $10^5$ or more bits in size and require large memory consumption for its representation. For a structured LDPC code, each of the elements of the matrix H may be represented as a subblock of a predetermined size, as illustrated in FIG. 7. In FIG. 7, each element of the matrix H represents one subblock.

In the IEEE 802.16e technical specifications, each subblock is represented as one integer index, thereby reducing a memory size required to represent the matrix H. Each subblock may be, for example, a per matrix of a predetermined size.

FIG. 8 illustrates a model matrix according to an example.

For example, with reference made to the IEEE 802.16e technical specifications, a model matrix used for LDPC coding and decoding with a codeword size of 2304 and a code rate of ⅔ is given as illustrated in FIG. 8. The model matrix may be a parity check matrix with at least one subblock, which will be described below. Further, a subblock may be referred to as a shift number in the following description. The model matrix may be extended to a parity check matrix based on a method which will be described below. Accordingly, encoding and decoding based on a specific model matrix refers to encoding and decoding based on a parity check matrix to which the model matrix is extended.

In FIG. 8, index '−1' represents a zero matrix of a predetermined size, and index '0' represents an identity matrix of a predetermined size. Positive integer indexes except for index '−1' and index '0' represent shift numbers. For example, a subblock represented as index may be a matrix shifted once in a specific direction from an identity matrix.

Figures 9, 10:
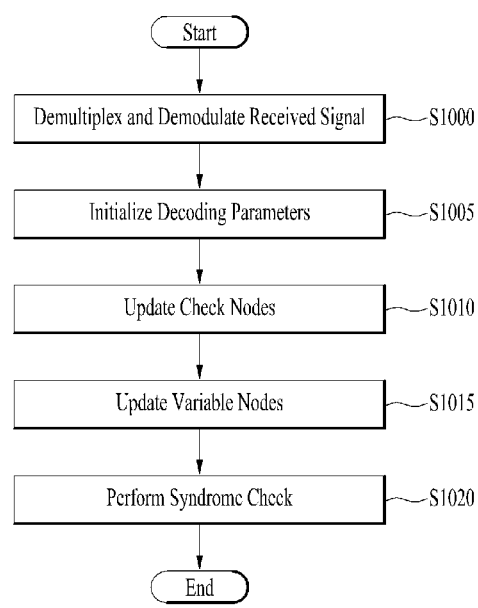
FIG. 9 illustrates matrix conversion according to the number of shifts.
FIG. 10 is a flowchart illustrating a method of decoding a low-density parity-check (LDPC) code according to an example.

FIG. 9 is a diagram illustrating matrix conversion based on a shift number.

For example, FIG. 9 illustrates a subblock with 4 rows and 4 columns. In FIG. 9, the subblock is shifted three times to the right from an identity matrix. In this case, the parity check matrix of the structured LDPC code may represent subblocks by integer index '3'.

In general, an LDPC code may be encoded by generating a generator matrix C from a parity check matrix H and encoding information bits by the generator matrix G. To generate the generator matrix G, a matrix is configured in the form of [$P^T$:I] through Gaussian reduction of the parity check matrix H. When the number of information bits is k and the size of a codeword is n, P represents a matrix with k rows and (n-k) columns, and I represents an identity matrix of size k.

When the parity check matrix H is in the form of [$P^T$:I], the generator matrix G is in the form of [I:$P^T$]. When k information bits are encoded, the coded information bits may be represented as a matrix x with one row and k columns. In this case, a codeword c is xG in the form of [x:xP] where x represents an information part (or systematic part) and xP represents a parity part.

Further, the information bits may be encoded directly from the matrix H without deriving the matrix G by designing the matrix H in a special structure without using Gaussian reduction. From the foregoing structures of the matrices H and G, the product between the matrix G and the transpose matrix of the matrix H is 0. Relying on this property and the above-described relationship between information bits and a codeword, a codeword may be obtained by adding parity bits to information bits.

FIG. 10 is a flowchart illustrating a method of decoding an LDPC code according to an example.

In a communication system, coded data includes noise during transmission on a radio channel. Accordingly, a codeword c is represented as a codeword c' including noise at a receiver. The receiver demultiplexer and demodulates a received signal (S1000) and initializes decoding parameters (S1005). The receiver updates check nodes and variable nodes (S1010 and S1015) and performs a syndrome check (S1020). That is, the receiver may terminate the decoding procedure by determining whether c'$H^T$ is 0. When c'$H^T$ is 0, the first k bits of c' may be determined to be information bits x. When c'$H^T$ is not 0, the receiver may recover the information bits x by detecting c' that makes c'$H^T$ satisfy 0 based on a decoding scheme such as a sum-product algorithm.

Figure 11:
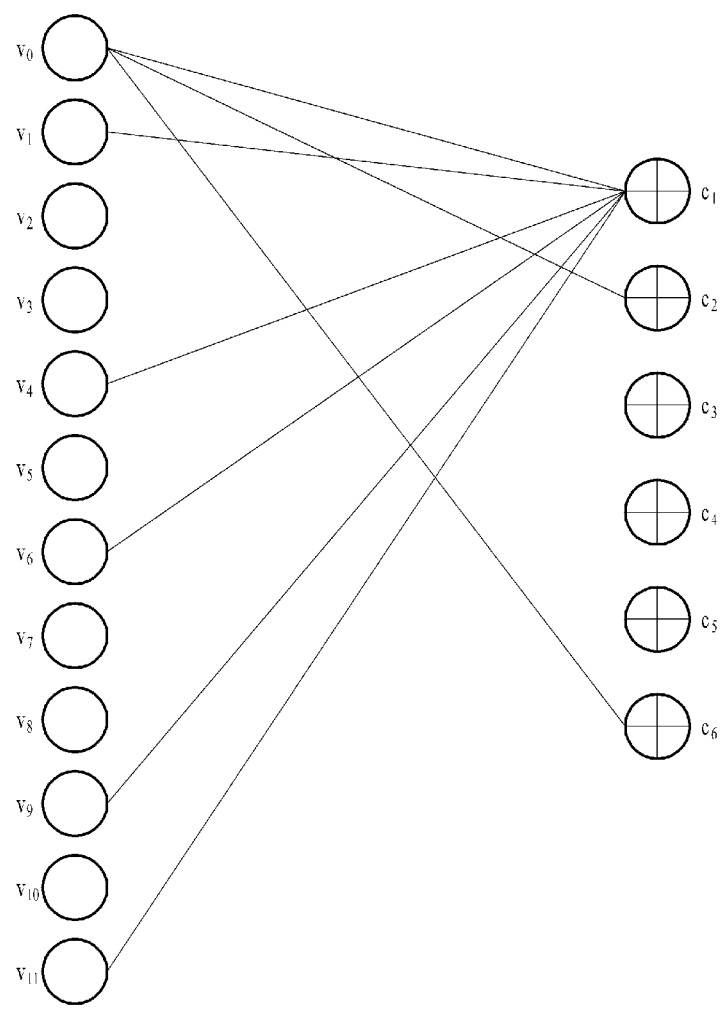
FIG. 11 illustrates a bipartite graph according to an example.

FIG. 11 illustrates a bipartite graph according to an example.

In FIG. 11, the left nodes $v_0, v_1, \ldots v_{11}$ are variable nodes and the right nodes $c_2, \ldots, c_6$ are check nodes. In the example of FIG. 11, the bipartite graph is illustrated with the variable node $v_0$ and the check node $c_1$ focused on, for the convenience of description. The connection lines of the bipartite graph of FIG. 11 may be referred to as edges. The bipartite graph of FIG. 11 may be generated from Hc'. Accordingly, in FIG. 11 edges from the variable node $v_0$ correspond to the first column of the parity check matrix H, and edges from the check node $c_1$ correspond to the first row of the matrix H.

As described above, for successful decoding, the product between the parity check matrix H and the transpose matrix of the codeword matrix c needs to be '0'. Accordingly, the values of variable nodes connected to one check node need to be 0. In FIG. 11, therefore, the XOR value of the values of the variable nodes $v_0, v_1, v_4, v_6, v_9,$ and $v_{11}$ connected to the check node $c_1$ needs to be '0'. The syndrome check refers to checking whether the XOR value of the values of variable nodes connected to each check node is 0.

Now, a description will be given of a spatially coupled LDPC (SC-LDPC) code. The following embodiments may be used for wireless communication or a storage device.

The SC-LDPC code is a kind of LDPC code in a convolutional form. The SC-LDPC code may have the performance of a maximum a posteriori (MAP) decoding threshold value of an LDPC code. Particularly, the SC-LDPC code is known as a code achieving a MAP decoding threshold based on a belief propagation algorithm.

Figure 12:
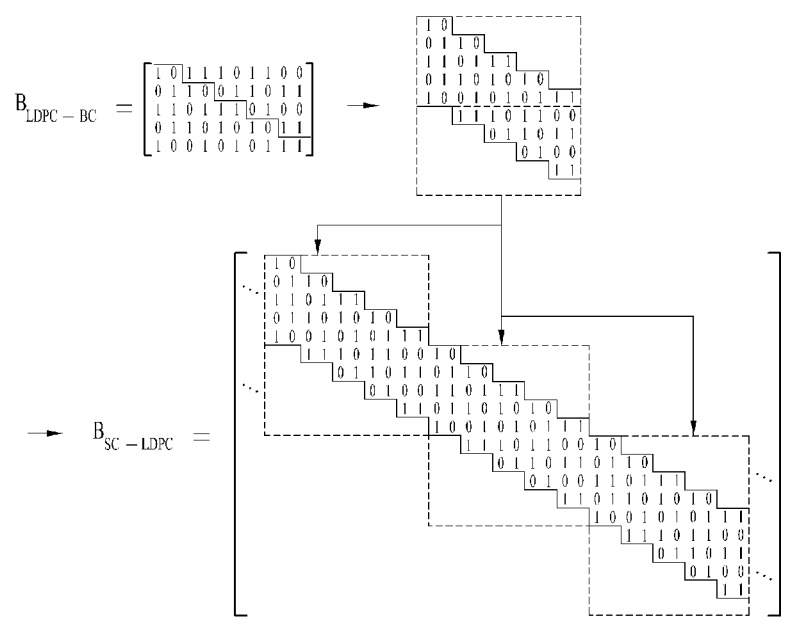

FIG. 12 is a schematic diagram illustrating generation of a base matrix for an SC-LDPC code in a cut-and-paste method.

A base matrix $B_{SC\text{-}LDPC}$ of the SC-LDPC code may be generated by repeatedly coupling one LDPC code. FIG. 12 illustrates a method of generating the base matrix $B_{SC\text{-}LDPC}$ of the SC-LDPC code in the cut-and-paste method. In FIG. 12, to generate the base matrix $B_{SC\text{-}LDPC}$ of the SC-LDPC code, a part of a base matrix $B_{LDPC\text{-}BC}$ of an LDPC block code (LDPC-BC) is cut off and attached under the remaining part. In this case, a coupling depth may be determined according to the number of columns over which the attached lower part and the remaining upper part overlap. In addition, as described above with reference to FIG. 8, a shift value may be applied. Then, the matrix with the upper part and the lower part combined is repeatedly attached in a diagonal form to generate the base matrix $B_{SC\text{-}LDPC}$ of the SC-LDPC code.

Figure 13:
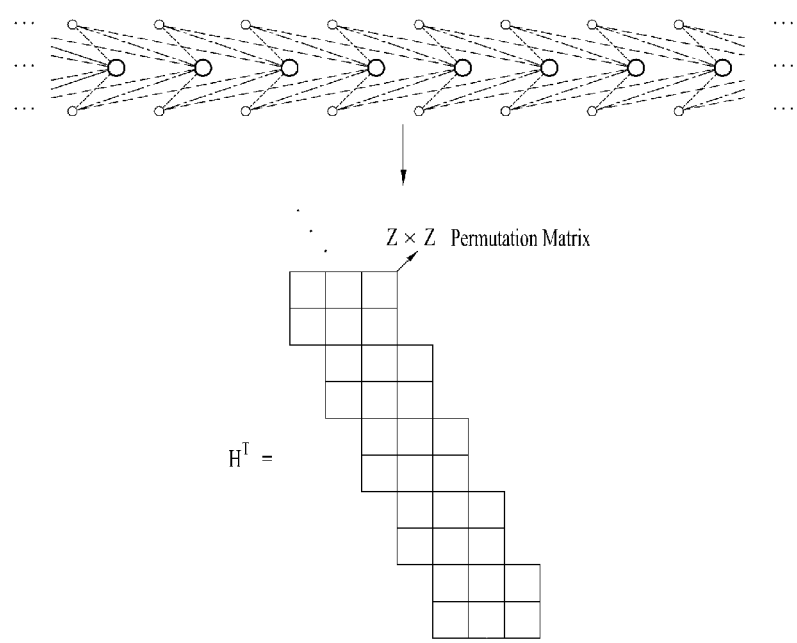
FIG. 13 is a schematic diagram illustrating generation of a parity check matrix for an SC-LDPC code in a protograph edge coupling method.

FIG. 13 is a schematic diagram illustrating generation of a parity check matrix for an SC-LDPC code in a protograph edge coupling method.

In the protograph of FIG. 13, the black points represent variable nodes and the white points represent check nodes. Each edge connected between points represents the connection relationship between a variable node and a check node. A protograph-based LDPC code may be constructed from a small protomatrix with a few elements. The protograph is a Tanner graph with a relatively small number of nodes. Parallel edges are allowed in the protograph. The protograph may be represented as a protomatrix representing the number of edges which connect corresponding variable nodes and check nodes. A protograph code (e.g., LDPC code) may be designed by applying "copy-and-permutation" to a protograph.

In FIG. 13, a matrix corresponding to the upper protograph is lifted by a permutation matrix. The lower part of FIG. 13 illustrates the transpose matrix $H^T$ of a parity check matrix corresponding to a protograph. Each rectangular block may be configured as a permutation matrix of size Z*Z (Z is an integer equal to or larger than 1).

The cut-and-paste method described with reference to FIG. 12 and the edge coupling method described with reference to FIG. 13 have low degrees of freedom in designing a parity check matrix for an SC-LDPC code. More specifically, with the cut-and-paste method, it is difficult to flexibly change the check degree of the base matrix of the SC-LDPC code. Moreover, very limited shapes may be formed by cutting the base matrix. In the protograph edge coupling method, only a coupling depth and a shift value are used as design parameters. Therefore, this method has limitations in designing a parity check matrix.

A method of generating a parity check matrix for an SC-LDPC code to increase the degree of freedom in designing a parity check matrix is described below. More specifically, the base matrix of an LDPC-BC may be decomposed into a plurality of decomposition matrices and the decomposition matrices may be spatially coupled. Further, a multistage lifting operation may be applied.

In the following embodiments, the parity check matrix of the SC-LDPC code may be generated in a different manner from the above-described cut-and-paste method or protograph edge coupling method. For example, the base matrix of an LDPC-BC may be decomposed into M decomposition matrices (M is an integer equal to or larger than 2). After the M decomposition matrices are spatially coupled, a multistep lifting operation may be performed. In forming M decomposition matrices, various types of decomposition matrices may be generated. Thus, the degree of freedom in designing the base matrix of an SC-LDPC code may be increased.

A rectangle with vertexes corresponding to elements having non-zero values in a matrix forms a cycle. The length of the cycle is the number of elements included on all sides of the rectangle that forms the cycle. Thus, the length of the shortest cycle is 4. Cycles included in a parity check matrix are cyclic. Therefore, it is difficult to expect performance improvement from iterative decoding or the like. Thus, the performance of the parity check matrix may be determined according to the length of the cycle. More specifically, the shortest of the cycles included in the parity check matrix may be referred to as a short cycle. It is expected that the shorter the cycle, the lower the performance of the parity check matrix. Therefore, the performance of the parity check matrix tends to be determined by the short cycle. Accordingly, decomposition may be applied in the following embodiments to reduce the number of short cycles as much as possible. A Latin Square algorithm or a progressive edge growth (PEG) algorithm may be applied to reduce the number of short cycles in the parity check matrix. Further, a 2-stage lifting operation may be performed using the base matrix and circulant shift value matrix of an SC-LDPC code. The 2-stage lifting operation may increase the minimum distance and girth of the SC-LDPC code. The minimum distance means the minimum Hamming distance between two codewords of the code. More specifically, the minimum distance may mean the minimum number of differences between bit values at individual positions in the two codewords. The girth means the length of the shortest cycle of the parity check matrix.

Figure 14:
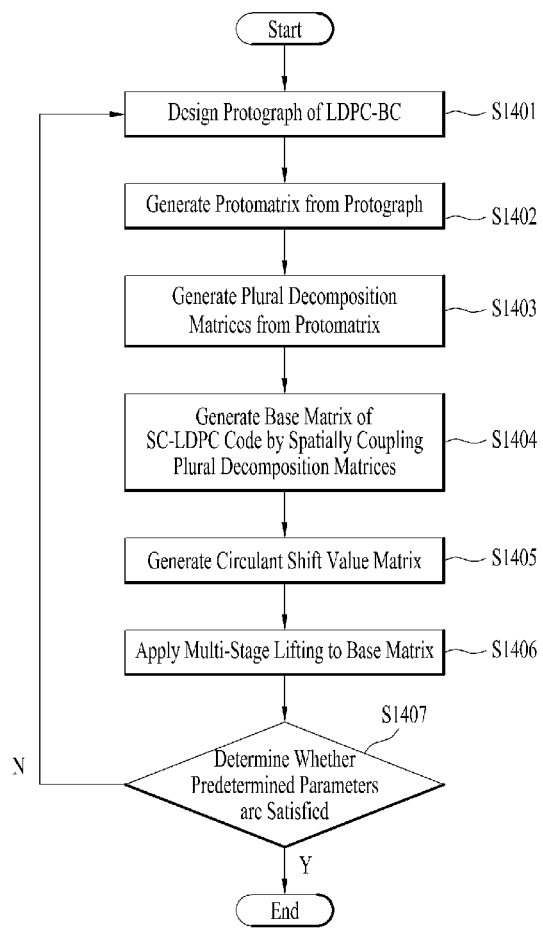
FIG. 14 is a flowchart illustrating a method of generating a protograph-based SC-LDPC code according to an embodiment.

FIG. 14 is a flowchart illustrating a method of generating a protograph-based SC-LDPC code according to an embodiment.

First, a protograph of an LDPC-BC is designed (S1401). For example, the protograph may be designed to have a threshold equal to or larger than a predetermined value in an additive Gaussian White Noise (AWGN) channel or a binary erasure channel (BEC). Further, a regular or irregular LDPC-BC may be used.

A protograph matrix is generated from the protograph (S1402). A protomatrix V may be generated from the relationship between variable nodes and check nodes in the protograph. The above-described steps S1401 and S1402 may be omitted. For example, a predetermined LDPC-BC base matrix may be used.

A plurality of decomposition matrices may be generated from the protomatrix (S1403). For example, M decomposition matrices (M is an integer equal to or larger than 2) may be generated by decomposing the protomatrix V. The M decomposition matrices may be denoted by $V_0, V_1, V_2, \ldots, V_{M-1}$, respectively. With reference to FIG. 15, criteria for decomposing the protomatrix V will be described below.

FIG. 15 illustrates generation of decomposition matrices according to an example.

FIG. 15 is a diagram explaining generation of decomposition matrices, to which the present disclosure is not limited. In FIG. 15, the protomatrix V is decomposed into three decomposition matrices $V_0, V_1$, and $V_2$. That is, the decomposition matrices have the same size as the protomatrix, and the sum of all the decomposition matrices is equal to the protomatrix. Thus, the elements of the protomatrix are distributed to the decomposition matrices.

In this case, the decomposition matrices may be generated such that the check degrees of corresponding rows in the decomposition matrices are equal. That is, the check degrees of corresponding rows in the decomposition matrices may be set to be equal. Referring to FIG. 15, the check degree of the first row in the protomatrix V is 6. Therefore, since the three decomposition matrices $V_0, V_1$, and $V_2$ are generated in the example of FIG. 15, the first rows of the decomposition matrices $V_0, V_1$, and $V_2$ may be configured to have a check degree of 2. Accordingly, the elements having a value of 1 in the first row of the protomatrix v are distributed to the first rows of the decomposition matrices, two elements to the first row of each decomposition matrix. In the embodiment of FIG. 15, the check degree is equally distributed to the decomposition matrices. However, when the check degree of the first row in the protomatrix is 5 and three decomposition matrices are generated, the check degree may not be distributed equally to the first rows of the decomposition matrices. In this case, the elements of the protomatrix may be distributed in a manner that minimizes the difference between the check degrees of corresponding rows in the decomposition matrices. For example, the check degrees of the first rows of the three decomposition matrices may be 2, 2, and 1, respectively.

Further, the decomposition may be performed such that the number of isolated short cycles and the number of short cycles are reduced. This is because the SC-LDPC code is vulnerable to an isolated cycle, like a general LDPC code. Referring to FIG. 15, two cycles marked with dotted lines are represented in the protomatrix. A short cycle is a cycle of length 4 marked with a dotted line at the right bottom. However, the short cycle of length 4 shares one corner with a cycle of length 8. Accordingly, the short cycle is not an isolated short cycle. An isolated short cycle may refer to a short cycle which does not share a corner with another cycle, among short cycles. In the example of FIG. 15, the protomatrix is decomposed into the decomposition matrices such that the decomposition matrixes do not include any cycle. Accordingly, the decomposition matrices may have improved performance, compared to the protomatrix.

For example, the decomposition matrices may be determined by simulation. For example, the decomposition matrices $V_0$ and $V_1$ having lowest FERs may be determined by changing the check degree of each row in the decomposition matrices.

Further, the base matrix of the SC-LDPC code may be generated by spatially coupling the plurality of decomposition matrices (S1404). For example, the decomposition matrices may be spatially coupled to each other for a termination length.

A circulant shift value matrix may be generated from the base matrix of the SC-LDPC code (S1405). To reduce short cycles (e.g., length-4 cycles), the circulant shift value matrix may be designed using a Latin Square algorithm or a PEG algorithm. Thus, the number of short cycles may be reduced. A short cycle may refer to a cycle of a predetermined length or less.

Multi-stage lifting may be applied to the base matrix of the SC-LDPC code (S1406). For example, a 2-stage lifting operation may be applied. 2-stage lifting refers to constructing a parity check matrix by performing lifting operations in two stages on non-zero elements of the base matrix. This is done to increase the minimum distance and girth of the SC-LDPC code. Further, the lifting size of each stage in the multi-stage lifting may be determined.

A description will be given below of a 2-stage lifting operation according to an embodiment.

First, the 2-stage lifting operation may be performed by two permutation matrices $Z_1$ and $Z_2$. For example, when a parity check matrix is constructed by a 1-stage lifting operation, a permutation matrix Z may be used. In this case, Z may correspond to $Z_1 \times Z_2$.

The lifting size may be smaller in the first lifting operation than in the second lifting operation. The PEG algorithm may be applied to the first lifting operation. The first lifting operation may be performed to remove parallel edges on the protograph. Further, as small a lifting matrix as possible may be used. For example, the lifting matrix used in the first lifting operation may be of size 2×2 or 3×3. The use of a small-size lifting matrix may minimize the number of short cycles (e.g., length-4 or length-6 cycles). Further, the shift value of the lifting matrix may be adjusted to reduce short cycles.

The second lifting operation may have a larger lifting size than the first lifting operation. The Latin Square algorithm may be applied to the second lifting operation. In this case, the girth of the parity check matrix may be increased by adjusting the Galios field size and shift value of the Latin Square algorithm.

It may be determined whether the parity check matrix designed as described above satisfies predetermined parameters (S1407). For example, the threshold, waterfall, and/or error floor of the parity check matrix may be predetermined as parameters. If the predetermined parameters are not satisfied, the above-described steps S1401 to S1406 may be repeated.

The parity check matrix may be defined according to the base matrix of the SC-LDPC, the determined circulant shift value matrix, and the plurality of lifting values. Further, an encoding procedure may be performed according to a generator matrix generated based on the parity check matrix. Therefore, while not shown in FIG. 14, an input signal may be encoded based on the base matrix of the SC-LDPC, the determined circulant shift value matrix, and the plurality of lifting values. The resulting codewords may be transmitted to the receiver.

The parity check matrix of the SC-LDPC code designed in the above method may be encoded in a similar manner to convolutional coding. Therefore, low-complexity encoding may be performed.

A codeword from the parity check matrix of the SC-LDPC code may be decoded by an SW decoder. The SC-LDPC code has high reliability at both ends of the codeword. Thus, SW decoding may lead to a smaller memory and a smaller maximum repetition number than for an LDPC-BC using full block flooding decoding. As a consequence, hardware complexity and computational complexity may be reduced. When the SW decoder is used, a window size W may be set to an integer multiple of the number of decomposition matrices to prevent degradation of FER performance.

With reference to FIGS. 16 to 20, a method of designing an SC-LDPC parity check matrix according to an embodiment will be described.

Figures 16, 17:
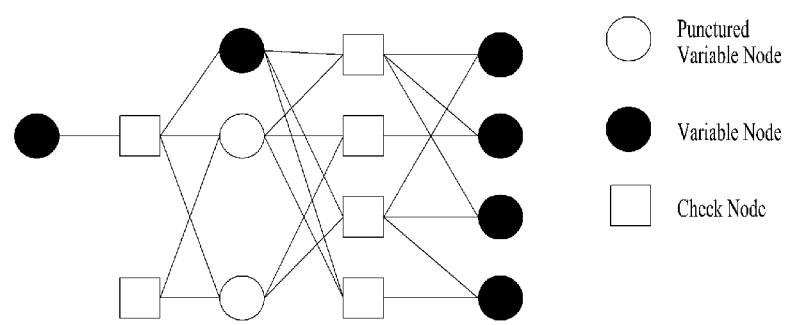
FIG. 16 is a protograph of an LDPC block code (LDPC-BC) according to an example.
FIG. 17 illustrates a protomatrix according to an example.

FIG. 16 illustrates a protograph of an LDPC-BC according to an example. In FIG. 16, a target code rate is ⅓. Thus, a part of variable nodes are punctured. The punctured variable nodes are marked with white circles. In FIG. 16, an irregular LDPC-BC is used.

FIG. 17 illustrates a protomatrix according to an example. A protomatrix V illustrated in FIG. 17 is derived from the protograph of FIG. 16. The protomatrix V may be generated from the relationship between variable nodes and check nodes of the protograph. Further, the protomatrix is decomposed into M matrices. For example, the M decomposition matrices may be denoted by $V_0, V_1, V_2, \ldots, V_{M-1}$, respectively. The protomatrix is equal to the sum of the decomposition matrices $V_0, V_1, V_2, \ldots, V_{M-1}$. Further, the base matrix of an SC-LDPC code may be generated by spatially coupling the decomposition matrices based on a terminal length L.

FIG. 18 illustrates a base matrix for an SC-LDPC code according to an example. In FIG. 18, M decomposition matrices are spatially coupled according to a termination length L.

FIG. 19 illustrates a base matrix for another SC-LDPC code according to another example. In FIG. 19, two decomposition matrices are spatially coupled according to a termination length L.

A circulant shift value matrix may further be applied to the base matrix. FIG. 20 illustrates a circulant shift number matrix according to an example. In the example of FIG. 20, given a primitive element β of a Galois field, GF($2^6$), the circulant shift value matrix is generated by the Latin Square scheme.

A parity check matrix may be generated by performing the afore-described 2-stage lifting operation on the base matrix. In the first stage, a lifting operation may be performed by a first permutation matrix. In the second stage, a lifting operation may be performed by a second permutation matrix. The first permutation matrix may be smaller in size than the second permutation matrix. For example, the PEG algorithm may be applied to the first permutation matrix, and the Latin Square algorithm may be applied to the second permutation matrix.

Finally, it may be determined whether the above steps are to be repeated based on the performance of the generated parity check matrix. It may be checked whether the parity check matrix generated based on the performance threshold, waterfall, and/or error floor of the parity check matrix satisfies a predetermined performance parameter.

FIG. 21a illustrates a parity check matrix according to an example.

In FIG. 21a, $H^T_{[0,n]}$ represents an SC-LDPC code generator matrix for encoding the following information sequence $u_{[0,n]}$.

$$u_{[0,n]} = [\mu_0, \mu_1, \ldots, \mu_n] \quad (3)$$

In FIG. 21a, an SC-LDPC code generator matrix is generated by spatially coupling decomposition matrices $h_1$ and $h_2$. $h_1^{(a)}(b)$ represents applying a cyclic shift value a to the decomposition matrix $h^1$. Further, b represents an n value of a corresponding information sequence of the parity check matrix. The generator matrix of the SC-LDPC code has a diagonal structure like a convolutional code, as illustrated in FIG. 21a. Accordingly, an SC-LDPC encoder may have low complexity.

Figure 21B:
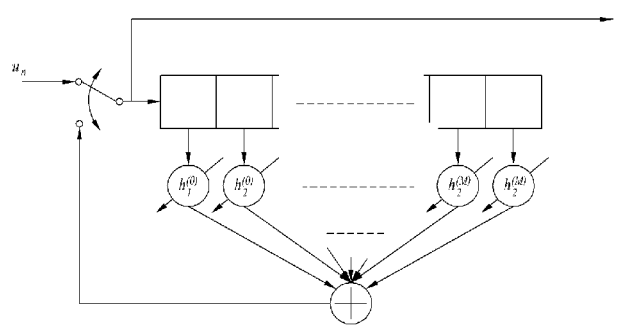
FIG. 21b illustrates the structure of an encoder according to an example.

FIG. 21b illustrates an encoder structure according to an example.

As illustrated in FIG. 21b, the SC-LDPC encoder of the present disclosure may be configured as an accumulator.

Figure 22:
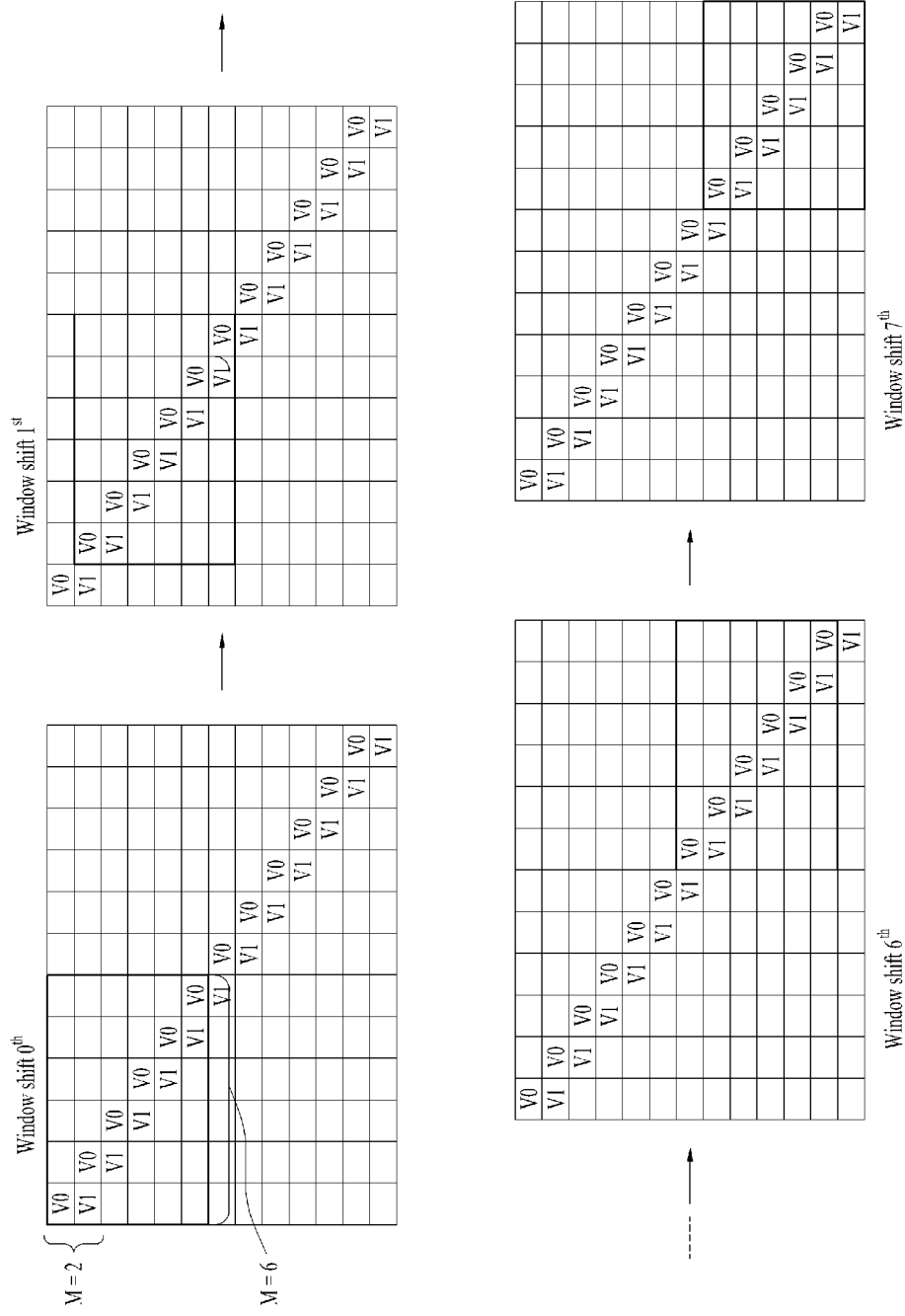
FIG. 22 is a conceptual diagram illustrating sliding window (SW) decoding.

FIG. 22 is a conceptual diagram illustrating SW decoding.

The SC-LDPC code has high reliability at both ends of a codeword. Therefore, the effect of both ends may be propagated to the center of the codeword by SW decoding which is wave-like decoding. Further, the size of a memory for storing a message value and a maximum repetition number may be reduced, compared to an LDPC-BC. Therefore, hardware complexity and computational complexity may be reduced.

In FIG. 22, CBs in the case of two decomposition matrices are illustrated. Information sequences encoded by the decomposition matrices are denoted by V0 and V1, respectively. As described before, a SW size may be set to an integer multiple of the number of decomposition matrices in order to prevent degradation of FER performance. In FIG. 22, the window size W is set to 6, three times the number M of decomposition matrices. As illustrated in FIG. 22, decoding may be performed, while the window is moving along the shape of a diagonal matrix.

FIG. 23 illustrates a base matrix V according to an example, and FIG. 24 illustrates decomposition matrices. Decomposition matrices $V_0$ and $V_1$ may be generated from the base matrix V according to the afore-described criteria.

FIG. 25 illustrates a base matrix according to an example. A base matrix B is generated by spatially coupling decomposition matrices $V_0$ and $V_1$. In FIG. 25, a termination length L is set to 6.

FIG. 26 illustrates a circulant shift value matrix according to an example. In the example of FIG. 26, given a primitive element β of a Galois field, GF($2^6$), the circulant shift value matrix is generated by the Latin Square scheme. A parity check matrix may be generated by performing a lifting operation on the base matrix based on the circulant shift value matrix.

FIG. 27 illustrates a base matrix for an SC-LDPC code according to an example.

FIG. 27 illustrates a base matrix B for a code rate of ⅔.

Figure 28:
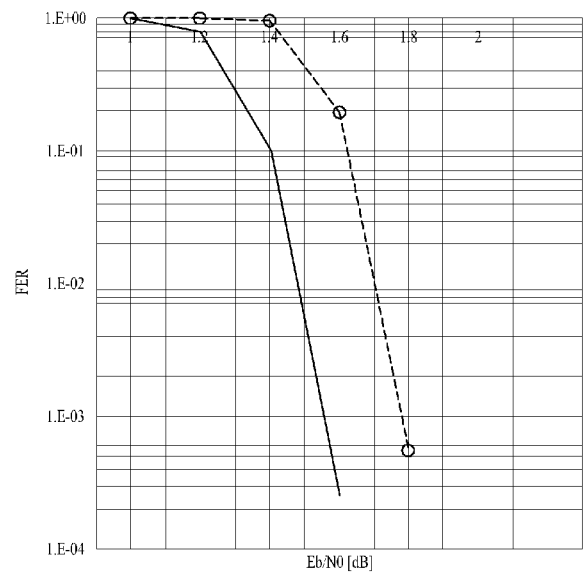
FIG. 28 illustrates frame error rates (FERs) according to an example.

FIG. 28 illustrates FERs according to an example.

In FIG. 28, the vertical axis represents FERs, and the horizontal axis represents ratios of energy per bit Eb to spectral noise density No. A dotted line represents the performance of an SC-LDPC code based on the base matrix of FIG. 27, and a solid line represents the performance of a Divsalar LDPC-BC. For details of the Divsalar LDPC-BC, see "The Design of Rate-Compatible Protograph LDPC Codes" (IEEE Transactions on Communications, October 2012, Thuy Van Nguyen, Aria Nosratinia, and dadari Divsalar). In FIG. 28, the length of an information block is 16392 and a code rate is ⅔. Further, a maximum repetition number is 200.2 bits are punctured for the SC-LDPC code, and 1 bit is punctured for the Divsalar LDPC-BC. As noted from FIG. 28, the SC-LDPC code according to the embodiment of the present disclosure has improved FER performance, compared to the Divsalar DLPC-BC.

Figure 29:
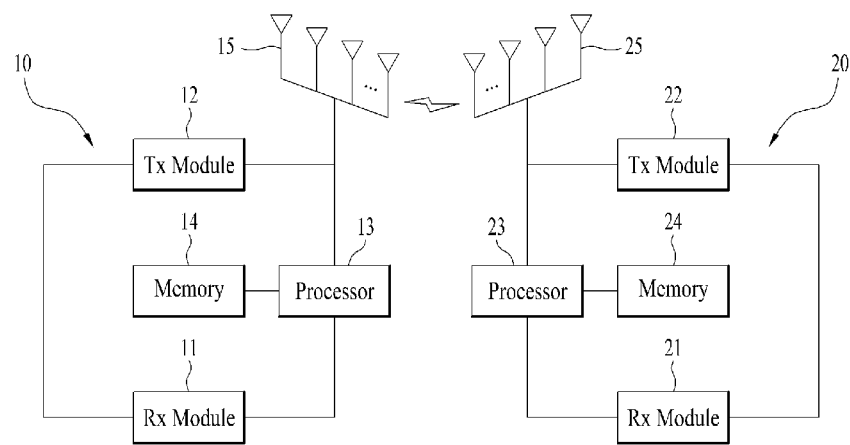
FIG. 29 is a block diagram illustrating a base station (BS) and a user equipment (UE) according to an embodiment of the present disclosure.

FIG. 29 is a block diagram of the configurations of devices applicable to the embodiments of the present disclosure described before with reference to FIGS. 1 to 28, according to an embodiment of the present disclosure.

Referring to FIG. 29, a base station (BS) 10 may include a reception (Rx) module 11, a transmission (Tx) module 12, a processor 13, a memory 14, and a plurality of antennas 15. The Tx module 12 may transmit various signals, data, and information to an external device (e.g., a user equipment (UE)). The Rx module 11 may receive various signals, data, and information from an external device (e.g., a UE). The Rx module 11 and the Tx module 12 may be collectively called a transceiver. The processor 13 may provide overall control to the BS 10. The plurality of antennas 15 may be configured, for example, in a two-dimensional antenna array.

According to an example of the present disclosure, the processor 13 of the BS 10 may be configured to receive channel state information (CSI) according to examples proposed in the present disclosure. Besides, the processor 13 of the BS 10 may compute and process information received at and information transmitted from the BS 10. The memory 14 may store the computed and processed information for a predetermined time, and may be replaced with a component such as a buffer (not shown).

Referring to FIG. 29, a UE 20 may include an Rx module 21, a Tx module 22, a processor 23, a memory 24, and a plurality of antennas 25. The plurality of antennas 25 mean that the UE 20 supports multiple input multiple output (MIMO) transmission and reception. The Tx module 22 may transmit various signals, data, and information to an external device (e.g., a BS). The Rx module 21 may receive various signals, data, and information from an external device (e.g., a BS). The Rx module 21 and the Tx module 22 may be collectively called a transceiver. The processor 23 may provide overall control to the UE 20.

According to an example of the present disclosure, the processor 23 of the UE may be configured to transmit CSI according to examples proposed in the present disclosure. Besides, the processor 23 of the UE may compute and process information received at and information transmitted from the UE 20. The memory 24 may store the computed and processed information for a predetermined time, and may be replaced with a component such as a buffer (not shown).

The specific configuration of the UE 10 may be realized such that the foregoing descriptions of the various embodiments of the present disclosure are applied independently or in combination of two or more embodiments, and will not be described herein to avoid redundancy.

Various embodiments of the present disclosure have been described mainly in the context of a BS as a DL transmission entity or a UL reception entity and a UE as a DL reception entity or a UL transmission entity, which should not be construed as limiting the scope of the present disclosure. For example, the description of the BS may be applied in the same manner to a cell, an antenna port, an antenna port group, an RRH, a Tx point, an Rx point, an access point, a relay, and so on which serve as a DL transmission entity to a UE or a UL reception entity from a UE. Further, when a relay serves as a DL transmission entity to a UE or a UL reception entity from a UE, or when a relay serves as a DL reception entity from a BS or a UL transmission entity to a BS, the principle of the present disclosure described in various embodiments of the present disclosure may be applied in the same manner.

The embodiments of the present disclosure may be implemented through various means, for example, hardware, firmware, software, or a combination thereof.

In a hardware configuration, the embodiments of the present disclosure may be achieved by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

In a firmware or software configuration, a method according to embodiments of the present disclosure may be implemented in the form of a module, a procedure, a function, etc. Software code may be stored in a memory unit and executed by a processor. The memory unit is located at the interior or exterior of the processor and may transmit and receive data to and from the processor via various known means.

The above-mentioned embodiments correspond to combinations of elements and features of the present disclosure in prescribed forms. And, it is able to consider that the respective elements or features are selective unless they are explicitly mentioned. Each of the elements or features can be implemented in a form failing to be combined with other elements or features. Moreover, it is able to implement an embodiment of the present disclosure by combining elements and/or features together in part. A sequence of operations explained for each embodiment of the present disclosure can be modified. Some configurations or features of one embodiment can be included in another embodiment or can be substituted for corresponding configurations or features of another embodiment. And, it is apparently understandable that an embodiment is configured by combining claims failing to have relation of explicit citation in the appended claims together or can be included as new claims by amendment after filing an application.

While the present disclosure has been described and illustrated herein with reference to the preferred embodiments thereof, it will be apparent to those skilled in the art that various modifications and variations can be made therein without departing from the spirit and scope of the disclosure. Thus, it is intended that the present disclosure covers the modifications and variations of this disclosure that come within the scope of the appended claims and their equivalents.

INDUSTRIAL APPLICABILITY

The embodiments of the present disclosure are applicable to various wireless access systems and broadcasting communication systems. The various wireless access systems include 3GPP, 3GPP2, and/or institute of electrical and electronics engineers (IEEE) 802.xx systems. The embodiments of the present disclosure are applicable to all technical fields in which the various wireless access systems find their applications as well as the various wireless access systems.

What is claimed is:

1. A method of transmitting a signal by a user equipment (UE) comprising one or more memories that are operatively connected with one or more processors and that store one or more instructions that cause the one or more processors to perform the method, the method comprising:
   generating a plurality of decomposition matrices by decomposing a base matrix of a predetermined LDPC block code (LDPC-BC);
   generating a base matrix of a spatially coupled low-density parity-check (SC-LDPC) code by spatially coupling the plurality of decomposition matrices according to a termination length;
   generating a circulant shift value matrix from the base matrix of the SC-LDPC code;
   generating a plurality of lifting values for the base matrix of the SC-LDPC code;
   encoding an input signal based on a generator matrix defined by the base matrix of the SC-LDPC code, the circulant shift value matrix, and the plurality of lifting values; and
   transmitting the encoded signal from the UE to a base station,
   wherein the plurality of lifting values are generated based on a parity check matrix generating through multi-stage lifting operations on non-zero elements of the base matrix of the SC-LDPC code,
   wherein the multi-stage lifting operations include a first lifting operation and a second lifting operation,
   wherein the first lifting operation has a smaller lifting size than the second lifting operation and a progressive edge growth (PEG) algorithm is applied, and
   wherein the second lifting operation is performed after the first lifting operation and a Latin square algorithm is applied.

2. The method according to claim 1, wherein the circulant shift value matrix is generated by the Latin Square algorithm or the progressive edge growth (PEG) algorithm.

3. The method according to claim 1, wherein the plurality of decomposition matrices are generated to have a minimum difference between check degrees of corresponding rows.

4. The method according to claim 1, further comprising:
   transmitting the encoded signal to at least one of another UE, a UE related to an autonomous driving vehicle or a network.

5. A user equipment (UE) configured to perform wireless communications and comprising:

a transceiver;
one or more antennae;
one or more processors; and
one or more memories that are operatively connected with the one or more processors and that store one or more instructions that cause the one or more processors to perform an operation based on being executed, the operation comprising:
generating a plurality of decomposition matrices by decomposing a base matrix of a predetermined LDPC block code (LDPC-BC);
generating a base matrix of a spatially coupled low-density parity-check (SC-LDPC) code by spatially coupling the plurality of decomposition matrices according to a termination length;
generating a circulant shift value matrix from the base matrix of the SC-LDPC code;
generating a plurality of lifting values for the base matrix of the SC-LDPC code;
encoding an input signal based on a generator matrix defined by the base matrix of the SC-LDPC code, the circulant shift value matrix, and the plurality of lifting values; and
transmitting the encoded signal from the UE to a base station,
wherein the plurality of lifting values are generated based on a parity check matrix generating through multi-stage lifting operations on non-zero elements of the base matrix of the SC-LDPC code,
wherein the multi-stage lifting operations include a first lifting operation and a second lifting operation,
wherein the first lifting operation has a smaller lifting size than the second lifting operation and a progressive edge growth (PEG) algorithm is applied, and
wherein the second lifting operation is performed after the first lifting operation and a Latin square algorithm is applied.

6. The UE according to claim 5, wherein the circulant shift value matrix is generated by the Latin Square algorithm or the progressive edge growth (PEG) algorithm.

7. The UE according to claim 5, wherein the plurality of decomposition matrices are generated to have a minimum difference between check degrees of corresponding rows.

8. The UE according to claim 5, wherein the method further includes transmitting the encoded signal to at least one of another UE, a UE related to an autonomous driving vehicle or a network.

* * * * *